(12) United States Patent
Guiraud

(10) Patent No.: US 11,515,858 B2
(45) Date of Patent: Nov. 29, 2022

(54) TIME CONSTANT CALIBRATION CIRCUIT AND METHOD

(71) Applicant: SCALINX, Paris (FR)

(72) Inventor: Lionel Guiraud, Saint-Aubin-sur-Mer (FR)

(73) Assignee: SCALINX, Paris (FR)

( * ) Notice: Subject to any disclaimer, the term of this patent is extended or adjusted under 35 U.S.C. 154(b) by 0 days.

(21) Appl. No.: 17/453,298

(22) Filed: Nov. 2, 2021

(65) Prior Publication Data
US 2022/0173724 A1   Jun. 2, 2022

(30) Foreign Application Priority Data
Dec. 1, 2020 (EP) ................................ 20290079

(51) Int. Cl.
*H03H 11/12* (2006.01)
*H03M 3/00* (2006.01)

(52) U.S. Cl.
CPC .......... *H03H 11/1291* (2013.01); *H03M 3/38* (2013.01); *H03H 2210/021* (2013.01); *H03H 2210/025* (2013.01); *H03H 2210/028* (2013.01); *H03H 2210/043* (2013.01)

(58) Field of Classification Search
CPC ......... H03H 11/1291; H03H 2210/021; H03H 2210/025; H03H 2210/028; H03H 2210/043; H03M 3/38
See application file for complete search history.

(56) References Cited

U.S. PATENT DOCUMENTS

| | | | |
|---|---|---|---|
| 5,416,438 A | * | 5/1995 | Shibata .................. H03H 11/04 327/552 |
| 6,842,710 B1 | | 1/2005 | Gehring et al. |
| 7,477,098 B2 | | 1/2009 | Dharmalinggam et al. |
| 8,552,797 B2 | | 10/2013 | Lin |

OTHER PUBLICATIONS

Xia, et al. "An RC Time Constant Auto-Tuning Structure for High Linearity Continuous-Time SD Modulators and Active Filters", IEEE Transactions on circuits and systems vol. 51, No. 11, 10 pages, Nov. 2004.

\* cited by examiner

*Primary Examiner* — Dinh T Le
(74) *Attorney, Agent, or Firm* — Stoel Rives LLP

(57) ABSTRACT

A time constant calibration circuit and method. The circuit comprises a resistor, a capacitor, an amplifier, a first switch and a second switch. The resistance of the resistor and/or the capacitance of the capacitor is variable. A first terminal of the resistor, a first terminal of the capacitor and a first input of the amplifier are coupled to a common node, which is coupleable to a reference current source. A second input of the amplifier is coupleable to a reference voltage. An output of the amplifier is coupled to a second terminal of the resistor and a second terminal of the capacitor. The circuit can perform a calibration process comprising one or more calibration cycles in which the switches route a reference current through the resistor in a first phase and through the capacitor in a second phase. The resistance and/or the capacitance is adjusted between calibration cycles.

14 Claims, 7 Drawing Sheets

TIME CONSTANT CALIBRATION CIRCUIT AND METHOD

BACKGROUND

The present specification relates to a time constant calibration circuit and method.

Passive or active analog filter characteristics are often defined by a product of a resistance R by a capacitance C, denoted "RC". The RC product defines the cut-off frequency of such filters. Such filters may be of (but are not limited to) the low-pass, high-pass or band-pass type.

Analog filters are used in a variety of signal processing circuit such as analog-to-digital converters (ADCs), and in particular in continuous-time sigma-delta analog-to-digital converters (hereinafter ΣΔ ADCs). FIG. 1 depicts a functional diagram of an example ΣΔ ADC 10.

The ΣΔ ADC 10 includes an analog filter 6, a quantizer 8 and a feedback digital-to-analog converter 20 (hereinafter feedback DAC 20). The quantizer 8 and the feedback DAC 20 are controlled with a clock CLK signal 14 having a frequency f_clk. The analog filter 6 may generally comprise one or more analog integrators connected in series.

FIG. 2 shows an example of such an analog integrator 30, while FIG. 3 shows the transfer function of the analog integrator 30. An analog integrator 30 is a particular type of filter in which a first signal conversion is performed on the input signal voltage 32 ($V_{in}$), which is converted into a current I by means of a resistor 34 (R). A second conversion converts the current I back into a signal voltage 44 ($V_{out}$) by means of a capacitor 42 (C). A high-gain and high-bandwidth amplifier 40 may be used to create a virtual ground 36, allowing a simple combination of the first and second converted signals.

As illustrated in FIG. 3, the transfer function in the frequency domain of such an analog integrator 30 is $V_{out}=V_{in}/(j\omega RC)$. Such an analog integrator 30 is characterized in the time domain by its time constant τ=RC. The time constant τ is related to the unit gain frequency of the filter, $F_{unit}$ (i.e. the frequency at which the gain is equal to 1), in the frequency domain by the formula $$F_{unit}=1/(2\pi*\tau)=1/(2\pi*RC).$$

For optimum operation of the ΣΔ ADC 10, the RC time constant τ should be tightly related to the clock frequency f_clk. In particular, there should be a predefined/desired factor k of proportionality between τ and 1/f_clk. Deviation of the RC time constant τ from the optimum value may cause either distortion of the converted signal or increased noise. The precision of the RC time constant τ is therefore important to the operation of the ΣΔ ADC 10.

For typical ΣΔ ADCs, the required accuracy of the RC time constant τ is in the range of +/−5%. However, the resistance of a resistor in integrated circuit technology is generally only accurate to +/−15%, while the value of an integrated capacitance may vary by at least +/−20% due to component value spread during manufacturing. A time constant τ having a precision of +/−35% may not be sufficient for a great majority of applications.

Various schemes for measuring and adjusting an RC time constant are known in the state of the art.

A typical RC time constant calibration method involves charging a capacitor C with a current proportional to a resistor R and measuring the time T for the voltage across the capacitor to reach a reference voltage $V_{ref}$. The capacitance of the capacitor C or the resistance of the resistor R is then successively adjusted as a function of T, until T is equal to a reference time value $T_{ref}$.

However, the techniques used in the state of the art suffer from inaccuracy due to the presence of parasitic elements (e.g. parasitic capacitances and/or resistances). In modern applications, where the f_clk is in the range of gigahertz (GHz), the RC time constant τ tends to be relatively small and so is its capacitance value (i.e. in the order of a few hundreds of femtofarads). In such cases, even very small parasitic capacitances (e.g. of a few tens of femtofarads) added in the time constant estimation circuit may lead to inaccuracies of as high as 10%. This is not acceptable for high performance applications.

U.S. Pat. No. 6,842,710 describes method and system for calibrating a time constant within an integrated circuit. A voltage storage element is charged, and the time required to achieve a reference voltage on the storage element is measured. The measured time is compared to a desired time. An adjustable impedance is modified to change the charging time, and the cycle may be repeated until the charging time matches the desired time. In this manner, an actual RC time constant, as rendered in a particular integrated circuit, is measured and potentially adjusted to match a desired time constant. Configuration information of the adjustable impedance may be communicated to other circuitry within the integrated circuit to enable such circuitry to implement the same RC time constant in analog signal processing.

U.S. Pat. No. 7,477,098 describes a tuning circuit for tuning an active filter that includes a resistor-capacitor circuit comprising a variable capacitor and a resistor equivalent to a first resistor and a second resistor serially connected to the first resistor, a voltage generator for providing a constant reference voltage to the first resistor, a current replicating unit for replicating a current based on the constant reference voltage, a comparator for comparing a charging voltage as the current is charging a variable capacitor with the constant reference voltage, a counter for counting a number of cycles of a clock signal until the charging voltage reaches the constant reference voltage, an adjustment unit for calibrating a capacitance of the variable capacitor based on the number of cycles of a clock signal and a target count value associated with a predetermined RC time constant.

U.S. Pat. No. 8,552,797 describes that, in an RC calibration circuit, a single reference current is used to generate voltages across both a resistive and capacitive element. The component value of one of the resistive and capacitive element is successively altered until the voltages are substantially equal. Additionally, parasitic capacitances in the circuit are precharged to the resistive element voltage prior to the comparison. The circuit includes a comparator and a digital control circuit (DCW) including a successive approximation register (SAR) holding the value of the digital control word used to control the component value of the tunable resistive or capacitive element. The SAR alters the DCW in an iterative, bit-by-bit binary searching pattern in response to the comparator output.

"An RC Time Constant Auto-Tuning Structure for High Linearity Continuous-Time SD Modulators and Active Filters"; Authors: Bo Xia, Shouli Yan and Edgar Sanchez-Sinencio; IEEE Transactions on circuits and systems Vol. 51, No. 11, November 2004, describes an automatic RC time constant tuning scheme.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided a time constant calibration circuit comprising:
a resistor having a first terminal and a second terminal;
a capacitor having a first terminal and a second terminal;
an amplifier having a first input, a second input and an output; and
a plurality of switches including a first switch and a second switch,
wherein the resistance of the resistor and/or the capacitance of the capacitor is variable,
wherein the first terminal of the resistor, the first terminal of the capacitor and the first input of the amplifier are coupled together at a common node,
wherein the second input of the amplifier is coupleable to a reference voltage,
wherein the output of the amplifier is coupled to the second terminal of the resistor and to the second terminal of the capacitor,
wherein the first terminal of the resistor, the first terminal of the capacitor and the first input of the amplifier are coupleable to a reference current source at the common node, and
wherein the time constant calibration circuit is operable to perform a time constant calibration process comprising one or more calibration cycles in which:
the first switch and the second switch selectively route a reference current provided by the reference current source:
through the resistor in a first phase of the or each calibration cycle; and
through the capacitor in a second phase of the or each calibration cycle, and
the resistance of the resistor and/or the capacitance of the capacitor is adjusted between each calibration cycle iteratively to determine a resistance of the resistor and/or
a capacitance of the capacitor for producing said time constant.

Embodiments of this disclosure can provide a novel position of a reference current source and offset compensation mechanism, which may avoid calibration inaccuracies due to the parasitic capacitances Embodiments of this disclosure may be operable to perform calibration of a time constant $\tau=RC$ in a reduced number of operating phases.

In some embodiments, the first phase is a reference setting phase. In some embodiments, the second phase is an integration phase.

The common node may be a virtual ground node.

The time constant calibration circuit may comprise a comparator having a first input selectively coupleable to the second terminal of the resistor and/or the second terminal of the capacitor. The comparator can be used to assess whether the resistance of the resistor and/or capacitance of the capacitance is suitable for the desired time contestant in the calibration process.

The time constant calibration circuit may comprise digital logic operable to adjust the resistance of the resistor and/or the capacitance of the capacitor between each calibration cycle based on a signal received from an output of the comparator.

The time constant calibration circuit may further comprise a comparator switch coupled between the output of the comparator and a second input of the comparator. In the first phase the calibration circuit may be operable to close the comparator switch to configure the comparator in a voltage follower mode in which a voltage at the first input of the comparator is copied to the second input of the comparator. In the second phase the calibration circuit may be operable to open the comparator switch.

The time constant calibration circuit may comprise a storage capacitor coupled to the second input of the comparator for storing said voltage copied to the second input of the comparator in said first phase. The stored voltage may be compared with the voltage at the first input of the comparator in a next phase/cycle of the calibration process, to determine whether the resistance of the resistor and/or the capacitance of the capacitor has settled on a value that is consistent with the desired time constant.

The time constant calibration circuit may comprise digital logic operable to open/close the first and second switches to configure the time constant calibration circuit for the first phase and the second phase.

The time constant calibration circuit may be operable to output a control signal corresponding to a resistance value and/or a capacitance value determined by the time constant calibration circuit during said time constant calibration process. This function may be performed by digital logic of the time constant calibration circuit.

It is envisaged that the various digital logic components for performing the functions noted above may be provided in separate digital logic blocks, or in a single digital logic block (such as in the form of a controller).

According to another aspect of the present disclosure, there is provided a continuous-time sigma-delta analog-to-digital converter comprising the time constant calibration circuit set out above.

The continuous-time sigma-delta analog-to-digital converter may further comprise an analog filter having one or more analog integrators. The time constant calibration circuit may be operable to output the control signal corresponding to the resistance value and/or the capacitance value determined during the time constant calibration process to the analog integrator(s).

According to a further aspect of the present disclosure, there is provided an integrated circuit comprising:
the time constant calibration circuit as set out above, or
the continuous-time sigma-delta analog-to-digital converter as set out above.

According to another aspect of the present disclosure, there is provided a time constant calibration method comprising:
providing a calibration circuit comprising:
a resistor having a first terminal and a second terminal;
a capacitor having a first terminal and a second terminal;
an amplifier having a first input, a second input and an output; and
a plurality of switches including a first switch and a second switch,
wherein the resistance of the resistor and/or the capacitance of the capacitor is variable,
wherein the first terminal of the resistor, the first terminal of the capacitor and the first input of the amplifier are coupled together at a common node,
wherein the second input of the amplifier is coupled to a reference voltage,
wherein the output of the amplifier is coupled to the second terminal of the resistor and to the second terminal of the capacitor, wherein the first terminal of the resistor, the first terminal of the capacitor and the first input of the amplifier are coupled to a reference current source at the common node; and performing a time constant calibration process comprising one or more calibration cycles in which:

the first switch and the second switch selectively route a reference current provided by the reference current source:

through the resistor in a first phase of the or each calibration cycle; and through the capacitor in a second phase of the or each calibration cycle, and the resistance of the resistor and/or the capacitance of the capacitor is adjusted between each calibration cycle iteratively to determine a resistance of the resistor and/or a capacitance of the capacitor for producing said time constant.

Again, embodiments of this disclosure can provide a novel position of a reference current source and offset compensation mechanism, which may avoid calibration inaccuracies due to the parasitic capacitances Embodiments of this disclosure may be operable to perform calibration of a time constant τ=RC in a reduced number of operating phases.

In some embodiments, the first phase is a reference setting phase. In some embodiments, the second phase is an integration phase.

The common node may be a virtual ground node.

In embodiments in which the time constant calibration circuit comprises a comparator having a first input selectively coupleable to the second terminal of the resistor and/or the second terminal of the capacitor, the method may further comprise adjusting the resistance of the resistor and/or the capacitance of the capacitor between each calibration cycle based on a signal received from an output of the comparator. The comparator can be used to assess whether the resistance of the resistor and/or capacitance of the capacitance is suitable for the desired time contestant in the calibration process. In the event that the resistance of the resistor and/or capacitance of the capacitance does not yet produce the desired time constant, the resistance of the resistor and/or the capacitance of the capacitor may be adjusted as noted above.

The method may further comprise operating the comparator in a voltage follower mode in which a voltage at the first input of the comparator is copied to a second input of the comparator for storage of the voltage copied to the second input of the comparator. The stored voltage may be compared with the voltage at the first input of the comparator in a next phase/cycle of the calibration process, to determine whether the resistance of the resistor and/or the capacitance of the capacitor has settled on a value that is consistent with the desired time constant.

According to a further aspect of the present disclosure, there is provided a time constant calibration circuit comprising:

a resistor having a first terminal and a second terminal;
a capacitor having a first terminal and a second terminal;
an amplifier having a first input, a second input and an output; and
a plurality of switches including a first switch and a second switch,
wherein the resistance of the resistor and/or the capacitance of the capacitor is variable, wherein the first terminal of the resistor, the first terminal of the capacitor and the first input of the amplifier are coupled together at a common node, wherein the second input of the amplifier is coupleable to a reference voltage, wherein the output of the amplifier is coupled to the second terminal of the resistor and to the second terminal of the capacitor, wherein the first terminal of the resistor, the first terminal of the capacitor and the first input of the amplifier are coupleable to a reference current source at the common node.

The time constant calibration circuit may be operable to perform a time constant calibration process comprising one or more calibration cycles in which:

the first switch and the second switch selectively route a reference current provided by the reference current source:

through the resistor in a first phase of the or each calibration cycle; and through the capacitor in a second phase of the or each calibration cycle, and the resistance of the resistor and/or the capacitance of the capacitor is adjusted between each calibration cycle iteratively to determine a resistance of the resistor and/or a capacitance of the capacitor for producing said time constant.

According to another aspect of the present disclosure, there is provided a time a time constant calibration method comprising:

providing a calibration circuit comprising:
a resistor having a first terminal and a second terminal;
a capacitor having a first terminal and a second terminal;
an amplifier having a first input, a second input and an output; and
a plurality of switches including a first switch and a second switch,
wherein the resistance of the resistor and/or the capacitance of the capacitor is variable,
wherein the first terminal of the resistor, the first terminal of the capacitor and the first input of the amplifier are coupled together at a common node,
wherein the second input of the amplifier is coupled to a reference voltage,
wherein the output of the amplifier is coupled to the second terminal of the resistor and to the second terminal of the capacitor,
wherein the first terminal of the resistor, the first terminal of the capacitor and the first input of the amplifier are coupled to a reference current source at the common node.

The method may also include performing a time constant calibration process comprising one or more calibration cycles in which:

the first switch and the second switch selectively route a reference current provided by the reference current source:

through the resistor in a first phase of the or each calibration cycle; and through the capacitor in a second phase of the or each calibration cycle, and the resistance of the resistor and/or the capacitance of the capacitor is adjusted between each calibration cycle iteratively to determine a resistance of the resistor and/or a capacitance of the capacitor for producing said time constant.

BRIEF DESCRIPTION OF THE DRAWINGS

Embodiments of this disclosure will be described hereinafter, by way of example only, with reference to the accompanying drawings in which like reference signs relate to like elements and in which.

DETAILED DESCRIPTION

Embodiments of this disclosure are described in the following with reference to the accompanying drawings.

Embodiments of this disclosure can provide a novel position of a reference current source and offset compensation mechanism, which may avoid calibration inaccuracies due to the parasitic capacitances (denoted herein by $C_{P1}$ and $C_{P2}$) and comparator offset. Embodiments of this disclosure may be operable to perform calibration of a time constant τ=RC in a reduced number of operating phases (e.g. as few as two operating phases may be required in each calibration cycle).

Figure 1:
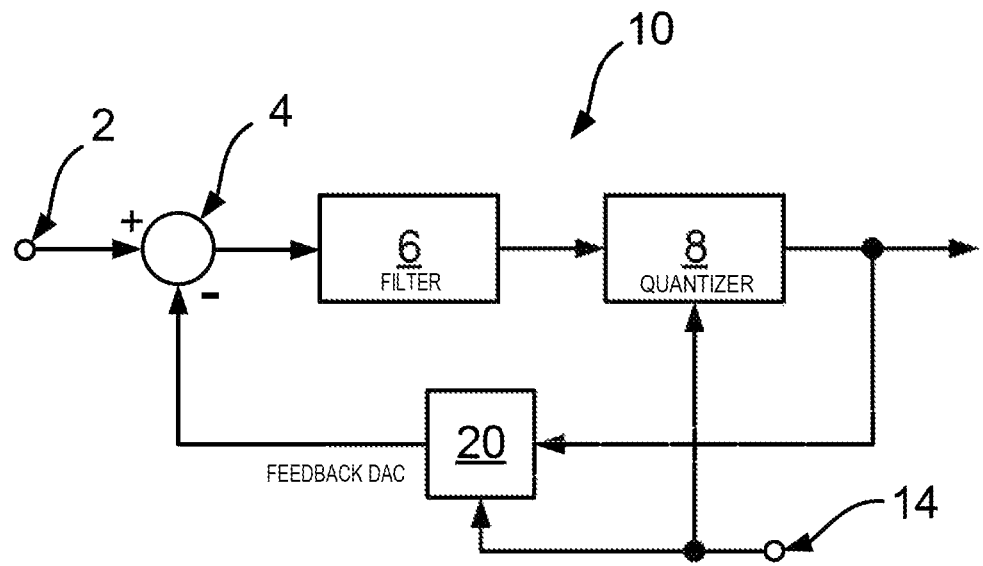
FIG. 1 shows a functional diagram of a ΣΔ ADC.
Figure 2:
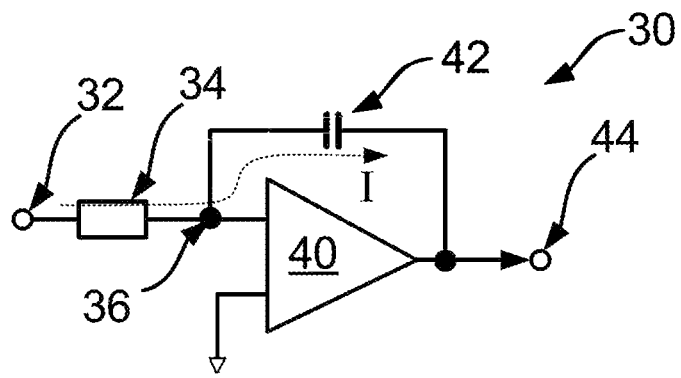
FIG. 2 shows an integrator.
Figure 3:
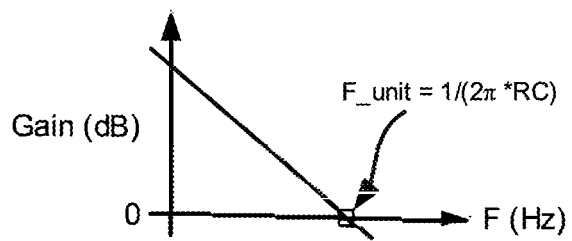
FIG. 3 shows the transfer function of the integrator shown in FIG. 2.

The principle of operation of the calibration method disclosed herein comprises charging a capacitor C with a reference current $I_{REF}$ for a predetermined time period $T_{REF}$. At the end of the predetermined time period $T_{REF}$, the voltage $V_C$ across the capacitor C is compared to a reference voltage $V_{REF}$, which may be provided by a reference resistor $R_{REF}$ and which may be stored across a capacitor $C_{STORE}$. If the voltage $V_C$ is lower than $V_{REF}$ then C may be reduced. On the other hand, if the voltage $V_C$ is higher than $V_{REF}$ then C may be increased. The calibration method disclosed herein may be determined as complete when $V_C$ is sufficiently close to $V_{REF}$ (for instance, when $V_C$ matches $V_{REF}$ to within a predetermined error margin, such as an error margin that corresponds to a minimum adjustment step in the value of C). Once the calibration method is complete, the capacitance value C may be supplied to one or more analog integrators (e.g. analog integrators 30 of the kind described above in relation to FIGS. 2 and 3) of a filter (such as the analog filter 6 of the kind described above in relation to FIG. 1). The capacitance value C may be supplied using a digital signal, such a digital capacitor adjustment command (DCAC).

In some embodiments an alternative approach may be taken in which, instead of performing iterations in which a capacitor C is charged with a reference current $I_{REF}$ for a predetermined time period $T_{REF}$ (after which $V_C$ is compared to a reference voltage $V_{REF}$), the time for the voltage $V_C$ across C to reach $V_{REF}$ is measured. In this alternative implementation, a counter, clocked with a reference clock, may start counting at the beginning of the charging operation of C and then stop when $V_C$ is equal to or exceeds $V_{REF}$. The content of the counter is indicative of the time for the $V_C$ to reach $V_{REF}$. C may then be adjusted, based on a comparison of the actual value of the counter to a reference time value $T_{REF}$. These iterations may continue until $V_C$ just reaches $V_{REF}$ after a targeted duration $T_{REF}$.

Figure 4:
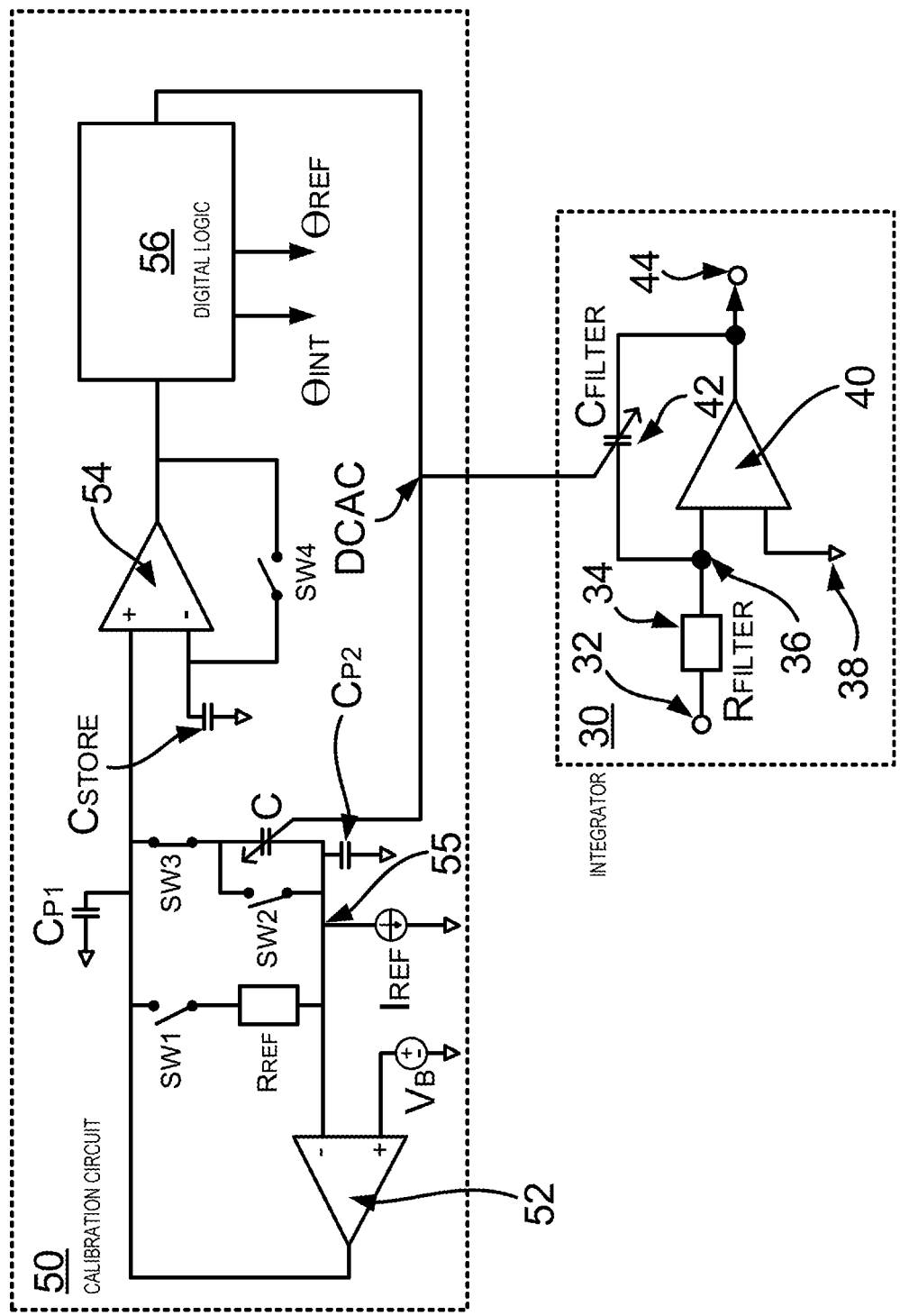
FIG. 4 shows a time constant calibration circuit according to an embodiment of this disclosure.

FIG. 4 shows a time constant calibration circuit 50 according to an embodiment of this disclosure.

The calibration circuit 50 may be coupled to one or more analog integrators 30 of an analog filter of a ΣΔ ADC, so that the calibration circuit 50 can output a calibrated capacitance value to the analog integrator(s) 30 (e.g. using a digital capacitor adjustment command, DCAC, as will be described in more detail below). Note that in this embodiment, the analog integrator(s) 30 may be similar in design to the analog integrator 30 described above in relation to FIGS. 2 and 3. As such, the analog integrator 30 may include an input 32 for receiving a voltage $V_{in}$, a resistor 34 having a resistance $R_{FILTER}$ for converting the input voltage $V_{in}$ into a current I, and a capacitor 42 having a variable (e.g. programable using the DCAC) capacitance $C_{FILTER}$ for converting the current I into a signal voltage ($V_{out}$) to be outputted at output 44. The analog integrator 30 may also include an amplifier 40, which may be a high-gain and high-bandwidth amplifier, to create a virtual ground 36, allowing a simple combination of the first ($V_{in}$→I) and second (I→$V_{out}$) converted signals, as explained previously in relation to FIG. 2. A first input of the amplifier 40 maybe coupled to the virtual ground (node) 36 and a second input of the amplifier 40 may be connected to a reference voltage (e.g. ground). An output of the amplifier 40 may be connected to the output 44. The capacitor 42 may be coupled in parallel with the first input and the output of the amplifier 40.

The analog integrator 30 may have a transfer function in the frequency domain of the kind described above in relation to FIG. 3.

While only a single analog integrator 30 is shown in FIG. 4, it will be appreciated that a device such as a ΣΔ ADC in accordance with embodiments of this disclosure may comprise an analog filter having one or more analog integrators. In embodiments in which the analog filter has multiple analog integrators, the analog integrators may be coupled together in a linear chain by coupling the input 32 of each analog integrator 30 to the output 44 of a preceding analog integrator 30 in the chain.

In this embodiment, the calibration circuit 50 comprises:

A voltage generator, which generates a voltage $V_B$;

An amplifier $V_{AMP}$ 52;

A reference current source, which provides a reference current $I_{REF}$;

A reference resistor having a reference resistance $R_{REF}$;

A first switch SW1, and second switch SW2, a third switch SW3 and a fourth switch SW4;

A capacitor having a variable (e.g. programable) capacitance C;

A storage capacitor, which has a capacitance value $C_{STORE}$;

A comparator 54; and

Digital logic 56.

An output of the voltage generator ($V_B$) is coupled to a positive input of an amplifier $V_{Amp}$ 52, so as to provide a reference voltage $V_B$ to the amplifier $V_{AMP}$ 52.

An output of the amplifier $V_{AMP}$ 52 is coupled to a positive input of the comparator 54. A negative input of the comparator 54 is coupled to ground via the storage capacitor ($C_{STORE}$). An output of the comparator 54 is coupled to the negative input of the comparator 54 in a feedback loop. The coupling between the output of the comparator 54 and the negative input of the comparator 54 is switchable, using switch SW4. The output of the comparator 54 is also coupled to an input of the digital logic 56.

The digital logic 56 has an output coupled to a control input of the variable capacitor (C). The digital logic 56 is operable to control (vary) the capacitance of the variable capacitor (C), by outputting a control command to the variable capacitor (C). Similarly, the digital logic may control the capacitance of the filter capacitor $C_{FILTER}$ in one or more analog integrator(s) 30. The control command for the variable capacitor (C) and/or the filter capacitor(s) $C_{FILTER}$ may be a digital capacitor adjustment command (DCAC). The DCAC may comprise a digital word having a value that indicates the capacitance set value instructed by the command from the digital logic. The number of bits in the digital word may be chosen in accordance with the desired granularity of the capacitance control.

The digital logic 56 is also operable to control the switches SW1, SW2, SW3, SW4 during the operation of the calibration circuit 50. This control of the switches SW1, SW2, SW3, SW4 by the digital logic 56 may be implemented using control signal $\theta_{REF}$ and $\theta_{INT}$. The control signals $\theta_{REF}$ and $\theta_{INT}$ can be derived from a common signal, and may have opposite phase.

An output of the reference current source ($I_{REF}$) is coupled to a common node 55 of the reference resistor ($R_{REF}$), the variable capacitor (C) and the negative input of the amplifier $V_{AMP}$ 52. The common node 55 can act as a virtual ground which can be maintained constant by the amplifier $V_{AMP}$ 52, set in a feedback configuration.

The reference resistor ($R_{REF}$) and the first switch SW4 are coupled in series in a first branch between the negative input of the amplifier $V_{AMP}$ 52 and the output of the amplifier $V_{AMP}$ 52. The variable capacitor (C) and the third switch SW3 are coupled in series in a second branch between the negative input of the amplifier $V_{AMP}$ 52 and the output of the amplifier $V_{AMP}$ 52. The second switch SW2 is coupled in parallel to the capacitor C.

A number of parasitic capacitances $C_{P1}$, $C_{P2}$ are also marked in FIG. 4. The parasitic capacitance $C_{P1}$ is located between ground and a line connecting the output of the amplifier $V_{AMP}$ 52 to a positive input of the comparator 54. The parasitic capacitance $C_{P2}$ is located between ground and a line connecting a negative input of the amplifier $V_{AMP}$ 52 and the variable capacitor (C) (note that this line includes the common node 55).

During operation, a reference time constant $R_{REF}*C$ can be measured by the digital logic 56, which can adjust the value of C in a number of iterations such that $R_{REF}*C=T_{REF}$. This may be implemented in a two-phase process, which will now be described.

Figure 5:
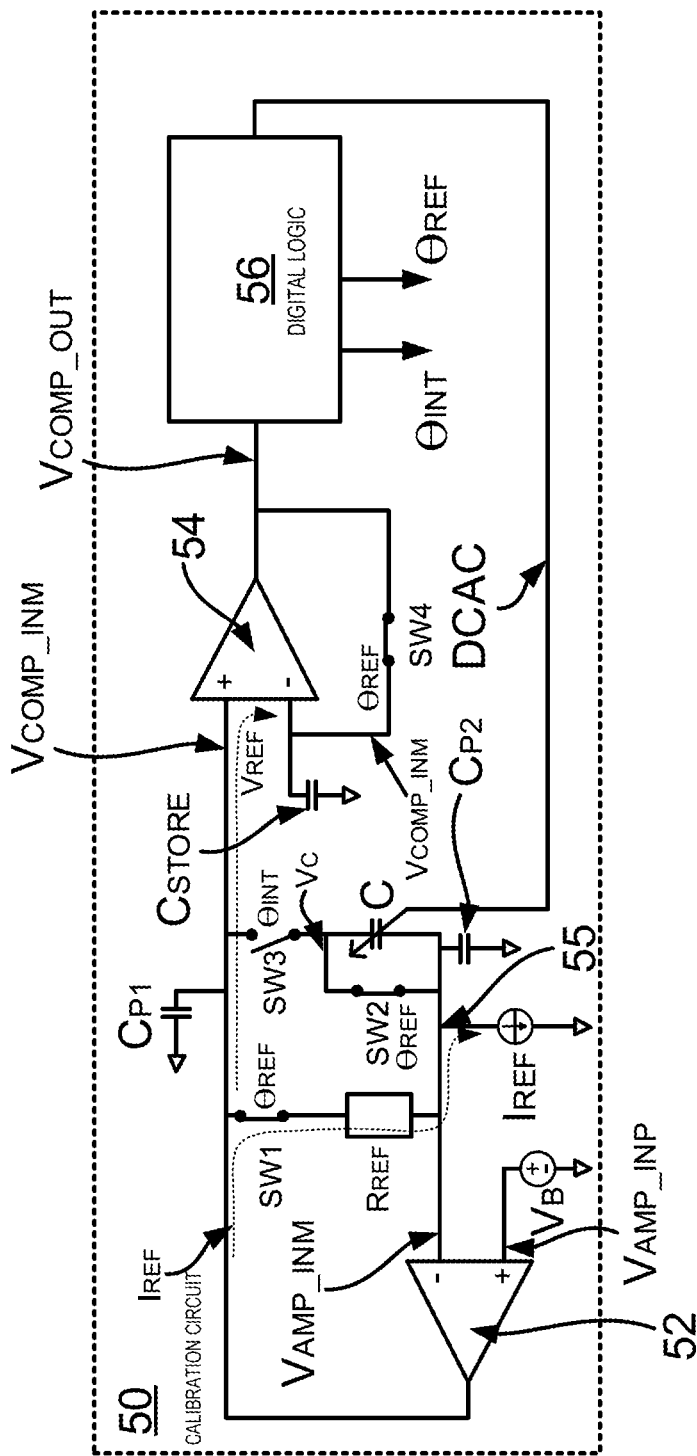
FIGS. 5 and 6 show operational phases of the time constant calibration circuit of FIG. 4 according to an embodiment of this disclosure.

In this embodiment, a first phase of the process may be referred to as a reference setting phase. The operation of the calibration circuit 50 during this phase is illustrated in FIG. 5. During the reference setting phase, the digital logic 56 controls the switches (e.g. using the control signals $\theta_{REF}$ and $\theta_{INT}$ as illustrated in FIG. 5) such that switches SW1, SW2, SW4 are closed and SW3 is open. This causes the variable capacitor (C) to be discharged. The amplifier $V_{AMP}$ 52, in closed-loop configuration, ensures that:

The voltage at the bottom terminals of the reference resistor ($R_{REF}$) and the variable capacitor (C) (i.e. the terminals of those two components which are coupled to the negative input of the amplifier $V_{AMP}$ 52), is set to $V_{AMP\_INM}=V_B+V_{OFFSET1}$, where $V_{OFFSET1}$ is an input offset of the amplifier $V_{AMP}$ 52; and The reference current $I_{REF}$ flows through the reference resistor ($R_{REF}$).

In this phase, the voltage $V_{REF}$ at the top terminal of the reference resistor ($R_{REF}$) (i.e. the terminal that is coupled to the output of the amplifier $V_{AMP}$ 52 via the switch SW1) is equal to $V_B+V_{OFFSET1}+I_{REF}*R_{REF}$. This voltage is applied to the positive input of the comparator 54. With the switch SW4 closed, the comparator 54 is configured as a voltage follower with the output of the comparator 54 coupled to the negative input of the comparator 54. The voltage at the output and the negative input of the comparator 54 is thus driven towards $V_{REF}$. This causes the storage capacitor ($C_{STORE}$) to store a voltage value given by $V_{REF}+V_{OFFSET2}$, where $V_{OFFSET2}$ is an input offset of the comparator 54.

At the end of the reference setting phase, the parasitic capacitance $C_{P2}$ is charged to $V_B+V_{OFFSET1}$. The duration of the first phase may be defined such that the calibration circuit 50 has sufficient time to drive $I_{REF}$ into $R_{REF}$ and apply $V_{REF}$ to the positive input of the comparator 54 and then to the negative input of the comparator 54.

In this embodiment, a second phase of the process may be referred to as an integration phase. $V_B+V_{OFFSET1}+I_{REF}*R_{REF}+V_{OFFSET2}$.

The differential voltage $V_{COMP\_DIFF}$ between the positive ($V_{COMP\_INP}$) and negative ($V_{COMP\_INM}$) inputs of the comparator 54 at the end of the integration phase is:

$$V_{COMP\_DIFF} = V_{COMP\_INP} - V_{COMP\_INM}$$

$$V_{COMP\_DIFF} =$$
$$V_B + V_{OFFSET1} + I_{REF}/C * T_{REF} - (V_B + V_{OFFSET1} + I_{REF} * R_{REF} + V_{OFFSET2})$$

$$V_{COMP\_DIFF} = I_{REF}/C * T_{REF} - I_{REF} * R_{REF} - V_{OFFSET2}$$

Again, note that $V_{OFFSET2}$ is the input offset of the comparator 54. Having $V_{OFFSET2}$ in the equation of $V_{COMP\_DIFF}$ means that this offset can be cancelled. Indeed, the differential threshold of an ideal comparator is 0 (zero) and if there is an offset $V_{OFFSET2}$, then the differential threshold is equal to this offset $V_{OFFSET2}$.

Depending on the value at the output of the comparator 54 at the end of each integration phase, the digital logic 56 can adjust the capacitance of the variable capacitor (C) successively to a value $C_{ADJ}$. If the output of the comparator 54 is high at the end of an integration phase, then the capacitance of the variable capacitor (C) can be increased. On the other hand, if the output of the comparator 54 is low at the end of an integration phase, then the capacitance of the variable capacitor (C) can be decreased.

The process described above may be repeated in a number of iterations (each iteration including a reference setting phase followed by an integration phase) until the calibration circuit 50 settles at a differential input $V_{COMP\_DIFF}$ of the comparator 54 that is substantially equal to the differential threshold $V_{OFFSET2}$. We get then:

$$I_{REF}/C_{ADJ} * T_{REF} - I_{REF} * R_{REF} = 0$$

$$C_{ADJ} * R_{REF} = T_{REF}$$

As the calibration circuit 50 can be viewed as a time-discrete system, when the calibration circuit 50 reaches the desired point, the capacitance of variable capacitor (C) will generally toggle within the smallest capacitance step (which may correspond to the increment associated with the least significant bit (LSB) of a control word applied to the variable capacitor (C) by the digital logic 56).

In accordance with embodiments of this disclosure, the measured time constant is not dependent on the parasitic capacitances $C_{P1}$, $C_{P2}$. In accordance with embodiments of this disclosure, the measured time constant is not dependent upon the input offset of the comparator 54 and/or the amplifier $V_{AMP}$ 52. Moreover, each calibration cycle may only require two phases (the reference setting phase followed by an integration phase noted above).

Once the calibration circuit 50 has settled at the capacitance value that yields the desired time constant, the digital logic 54 may output a control signal to the filter capacitor 42 in one or more analog integrators 30 (see FIG. 4) so as to set the capacitance of the filter capacitor(s) 42 to that capacitance value. As explained previously, this may be achieved using a digital capacitor adjustment command (DCAC), which may be a digital (e.g. binary) word.

Accordingly, the calibration circuit 50 may include an innovative placement of a unique reference current source, used for generating a reference voltage and charging a capacitor such that the calibration is natively insensitive to parasitic capacitance. In contrast to some state of the art designs, the reference current source may be located on a virtual ground side of a reference resistor and capacitor. In accordance with embodiments of this disclosure, a reference current may flow only through the capacitor under calibration (i.e. the variable capacitor (C)) and may not diverted into a parasitic capacitance.

In accordance with embodiments of this disclosure, the search algorithm executed by the digital logic 54 of the calibration circuit 50 may be a classical binary (dichotomy) search or a linear search.

Figure 6:
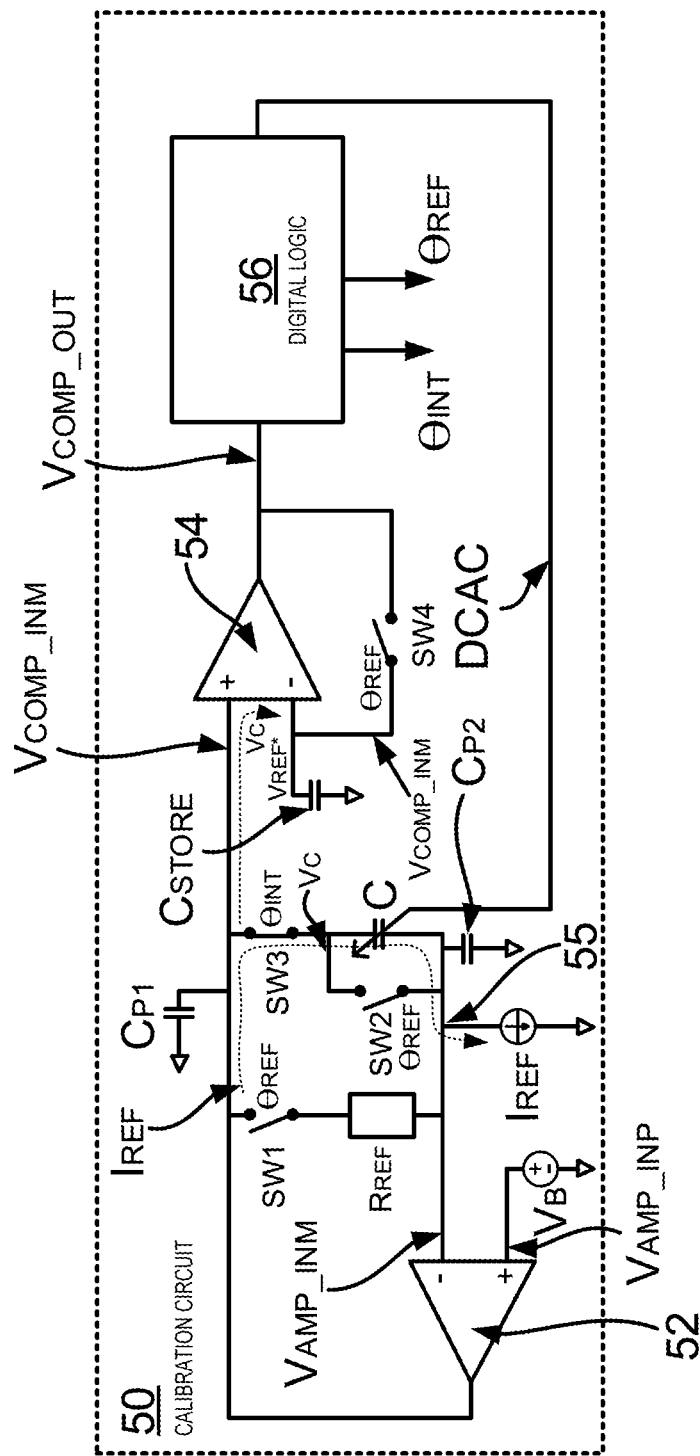
Figure 7:
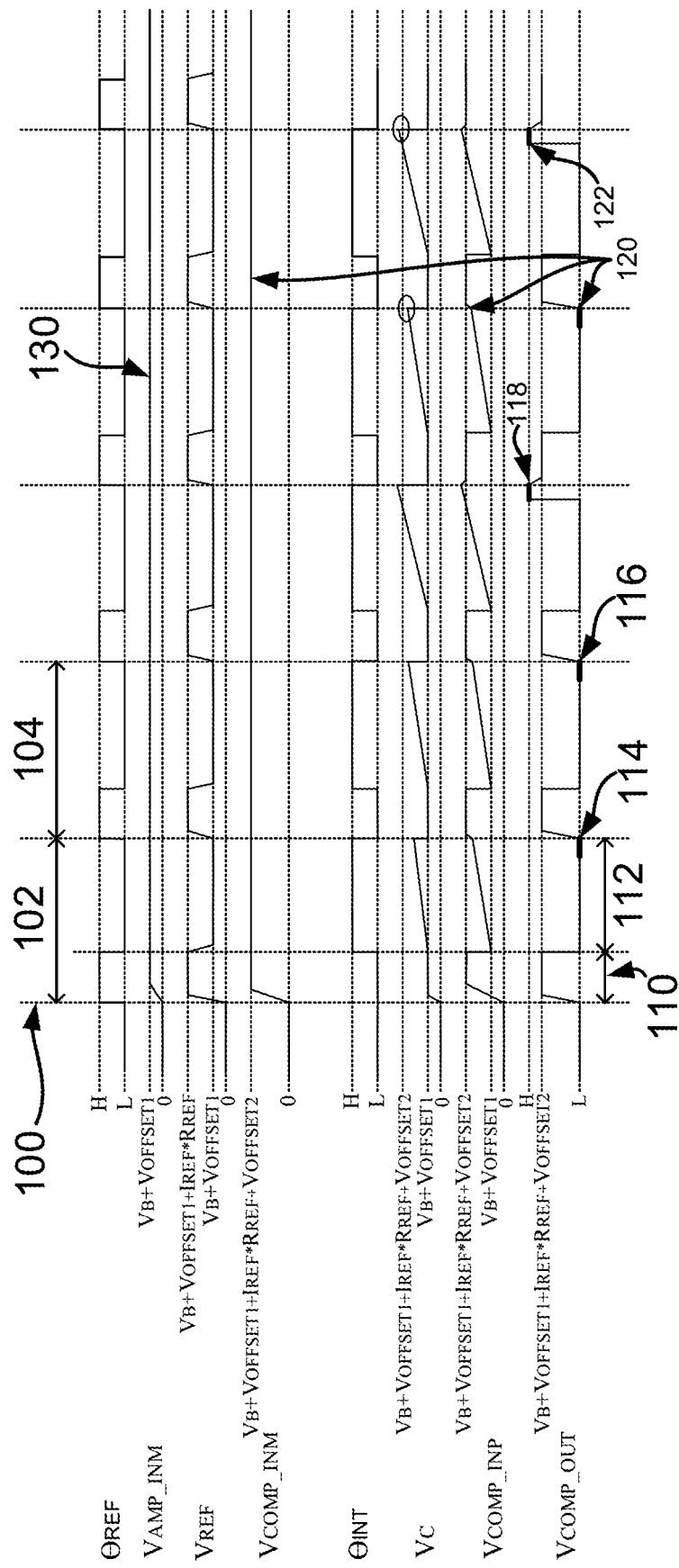
FIG. 7 shows signal waveforms of the time constant calibration circuit of FIGS. 4 to 6 during a linear search method according to an embodiment of this disclosure.

FIG. 7 shows signal waveforms of the time constant calibration circuit 50 of FIGS. 4 to 6 during a classical linear search method according to an embodiment of this disclosure. FIG. 7 shows a plurality of calibration cycles (102, 104 . . . ), each calibration cycle including a first (e.g. reference setting) phase 110 (in which $\theta_{REF}$ is high and $\theta_{INT}$ is low) followed by a second (e.g. integration) phase 112 (in which $\theta_{REF}$ is low and $\theta_{INT}$ is high). Virtual ground is denoted by the reference number 130 in FIG. 7. As can be seen in FIG. 7, at the end 114 of the first calibration cycle 102 in this example, the output of the comparator 54 is at logic LOW level thus C is decreased at the next cycle. Similarly, at the end 116 of the next calibration cycle 104 in this example, the output of the comparator 54 is again at logic LOW level thus C is once again decreased at the next cycle. In contrast, at the end 118 of the next cycle, the output of the comparator 54 at logic HIGH level and C is increased. At the end 120 of the next cycle, the input voltages at the comparator 54 are substantially equal: $V_{COMP\_INP} = V_{COMP\_INM}$, indicating the capacitance of the variable capacitor (C) has converged on a value that yields the desired time constant. Thus, the calibration reaches convergence when the output of the comparator 54, at the end of the integration phase, toggles alternatively between logic H and logic L from one cycle to another (this can be seen in FIG. 7 by noting the H/L value of $C_{COMP\_OUT}$ at the cycle ends 118, 120, 122). The capacitor value toggles then above and below the desired value with a delta at most equal to the capacitance step value. While a linear search approach is shown in FIG. 7, it will be appreciated that other search methodologies may be followed (e.g. a binary search).

Although the effect of the parasitic capacitors $C_{P1}$ and $C_{P2}$ as well as input offsets of the comparator 54 and amplifier $V_{AMP}$ 52 are cancelled in the first embodiment, the resistance of switches SW1 and SW3 may still impact the accuracy of the measurement due to the voltage drop in relation to the current $I_{REF}$ flowing through these switches. Indeed, at the end of the reference setting phase, the voltage at the positive input of the comparator ($V_{COMP\_INP}$) may no longer be $V_B + I_{REF}*R_{REF}$ ($V_{OFFSET1}$ is ignored for simplicity here) but may instead be $V_B + I_{REF}*(R_{SW1}+R_{REF})$, owing to the resistance of the switch SW1. Similarly, the voltage at $V_{COMP\_INP}$ at the end of the integration phase may be $V_B + I_{REF}*(T_{REF}/C + R_{SW3})$ instead of $V_B + I_{REF}*T_{REF}/C$, owing to the resistance of the switch SW3.

Figure 8:
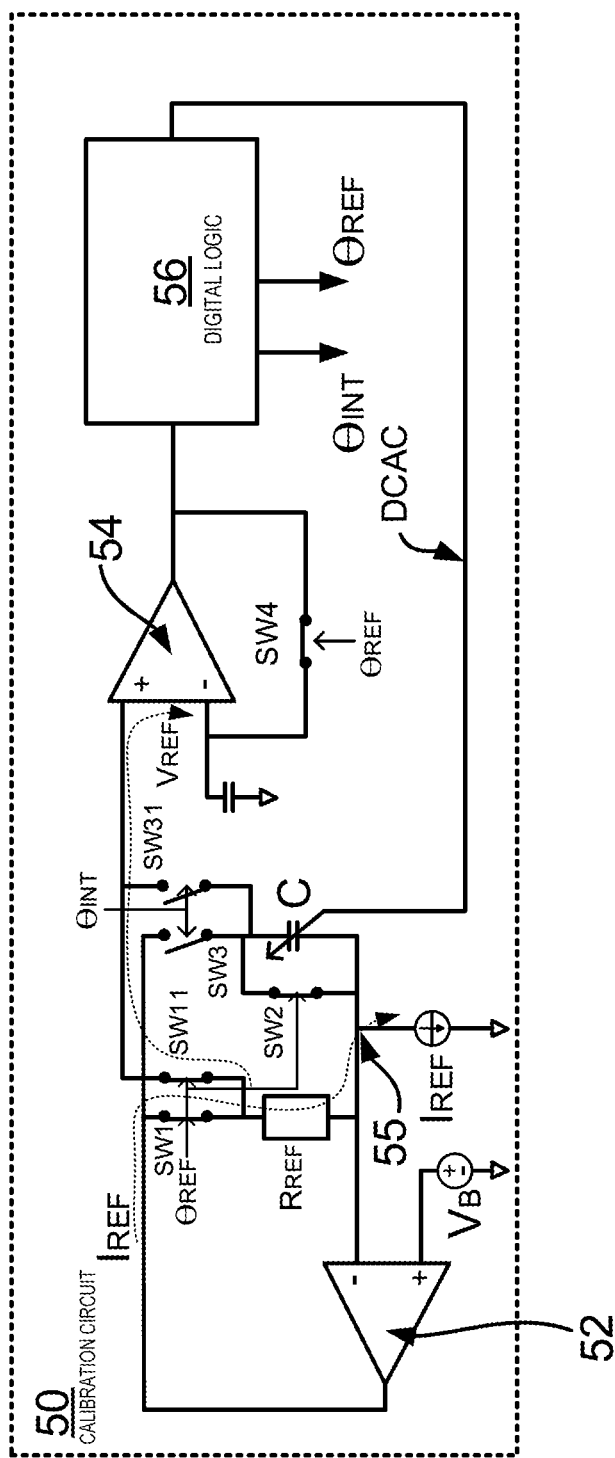
FIGS. 8 and 9 show operational modes of a time constant calibration circuit according to another embodiment of this disclosure.
Figure 9:
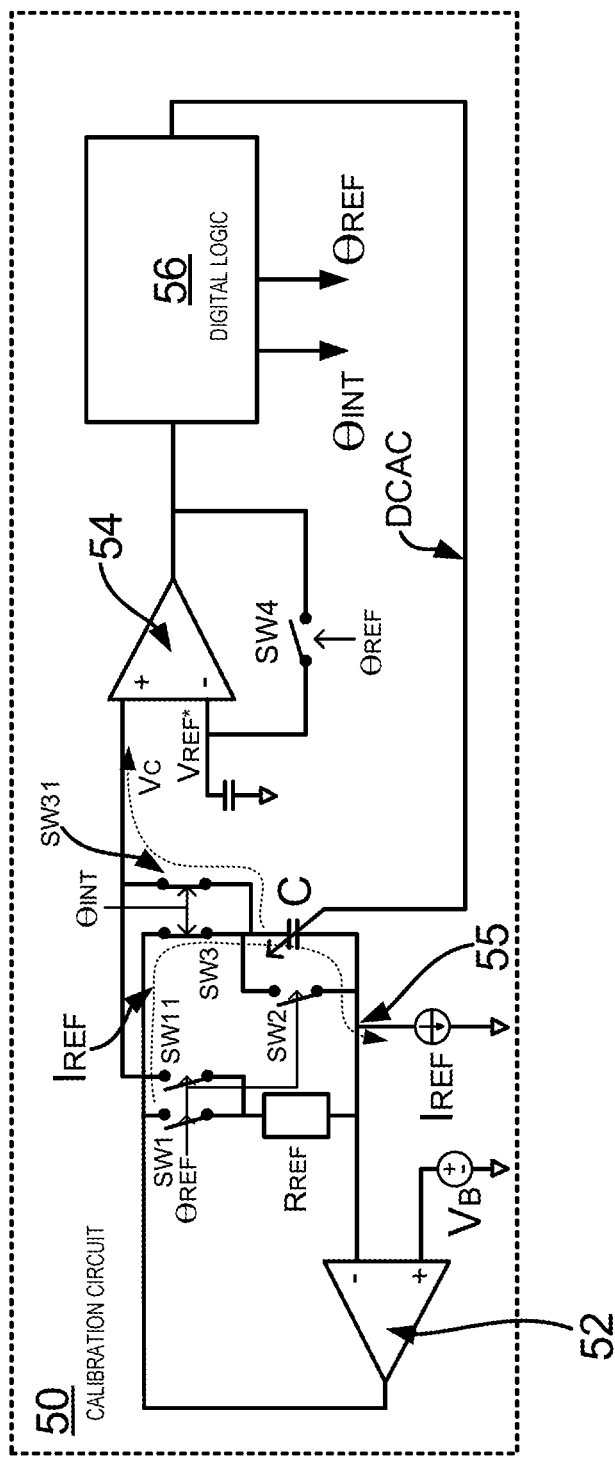

FIGS. 8 and 9 show operational modes of a time constant calibration circuit 50 according to another embodiment of this disclosure. The calibration circuit 50 itself is similar in some respects to the calibration circuit 50 described above in relation to FIGS. 4 to 7 and only the differences will be described below in detail. In this embodiment, the problem noted above in respect of the resistance of the switches modifying the voltages in the circuit, such as the voltage at the positive input of the comparator 54 may be addressed.

In the embodiment of FIGS. 8 and 9, two further switches SW11 and SW31 are added to the calibration circuit 50. The switch SW11 is coupled between a node located between the reference resistor ($R_{REF}$) and the switch SW1 and the positive input of the comparator 54. The switch SW31 is coupled between a node located between the variable capacitor (C) and the switch SW3 and the positive input of the comparator 54. Note that although the switches SW1 and SW3 are still coupled to the output of the amplifier $V_{AMP}$ 52, neither switch SW1, SW3 is coupled directly to the positive input of the comparator 54.

As in the embodiment of FIGS. 4 to 7, a calibration cycle performed by the calibration circuit 50 may include a reference setting phase followed by an integration phase. The operation of the calibration circuit 50 in the reference setting phase of this embodiment is shown in FIG. 8, while the operation of the calibration circuit 50 in the integration phase of this embodiment is shown in FIG. 9.

Again, the digital logic 56 may use control signals $\theta_{REF}$ and $\theta_{INT}$ to control the switches SW1, SW2, SW3, SW4, SW11, SW31 during these phases (the application of these control signals is noted in FIGS. 8 and 9).

In the reference setting phase (FIG. 8), switches SW1, SW11, SW2 and SW4 are closed, while switches SW3 and SW31 are open. This configuration couples the node between the switch SW1 and the reference resistor ($R_{REF}$) to the positive input of the comparator in the reference setting phase.

In the integration phase (FIG. 9), switches SW1, SW11, SW2 and SW4 are open, while switches SW3 and SW31 are closed. This configuration couples the node between the switch SW3 and the variable capacitor (C) to the positive input of the comparator in the integration phase.

The operation of the calibration circuit 50 in the reference setting phase shown in FIG. 8 is analogous to the operation of the calibration circuit 50 as illustrated in FIG. 5, while the operation of the calibration circuit 50 in the integration phase shown in FIG. 9 is analogous to the operation of the calibration circuit 50 as illustrated in FIG. 6. However, in the present embodiment, note that in neither phase does the current $I_{REF}$ flow through the switches SW11 or SW31. Because of this, no voltage drop will impact the accuracy of the measurements made at the comparator 54. Accordingly, the resistance of the switches of the calibration circuit 50 (e.g. SW1 and SW2) no longer interfere with the calibration measurement.

While the embodiments described above use a variable capacitor, an alternative approach is in envisaged in which the capacitor is a reference capacitor having a fixed capacitance and the reference resistor ($R_{REF}$) described above is replaced by a variable resistor. The operation of a calibration circuit in this kind of embodiment would be similar to the embodiments described above, except that instead of determining the capacitance of a variable capacitor which, in combination with reference resistor, produces the desired time constant, the calibration circuit instead determines the resistance of the variable resistor which, in combination with the reference capacitor, produces the desired time constant. The layout of circuits in such embodiments may be substantially the same as described above in relation to FIGS. 4 to 9. The digital logic 56 in such embodiments may use a control signal to vary the resistance of the variable resistor in each calibration cycle in much the same way as described above in respect of the variable capacitor (C), until the calibration circuit settles upon the resistance value that yields the desired time constant. In such embodiments, the calibration circuit may output a control signal to one or more analog integrators of an analog filter as described above. However, in such embodiments, the analog integrator(s) may comprise a variable resistor ($R_{FILTER}$) (instead of the variable capacitor ($C_{FILTER}$) described above in relation to FIG. 4), which may be set using the control signal from the calibration circuit to the resistance value that yields the desired time constant.

It is also envisaged that the approaches outlined above may be combined in an embodiment in which both the resistance of the resistor and the capacitance of the capacitor in the calibration circuit may be varied. In such a combined approach, the digital logic may vary the resistance of the resistor and/or the capacitance of the capacitor in each calibration cycle, and subsequently output resistance and capacitance values to analog integrator(s) of an analog filter comprising a variable filter resistor and filter capacitor. This can allow for further fine tuning of the time constant.

Accordingly, there has been described a time constant calibration circuit and method. The circuit comprises a resistor, a capacitor, an amplifier, a first switch, a second switch and a current source. The resistance of the resistor and/or the capacitance of the capacitor is variable. A first terminal of the resistor, a first terminal of the capacitor and a first input of the amplifier are coupled to a common node, which is coupleable to a reference current source. A second input of the amplifier is coupleable to a reference voltage. An output of the amplifier is coupled to a second terminal of the resistor and a second terminal of the capacitor. The circuit can perform a calibration process comprising one or more calibration cycles in which the switches route a reference current through the resistor in a first phase and through the capacitor in a second phase. The resistance of the resistor and/or the capacitance of the capacitor is adjusted between calibration cycles to determine a resistance and/or a capacitance for producing the time constant.

Although particular embodiments of this disclosure have been described, it will be appreciated that many modifications/additions and/or substitutions may be made within the scope of the claims.

The invention claimed is:

1. A time constant calibration circuit comprising:
a resistor having a first terminal and a second terminal;
a capacitor having a first terminal and a second terminal;
an amplifier having a first input, a second input, and an output;
a plurality of switches including a first switch and a second switch; and
digital logic configured to control the plurality of switches and adjust resistances of the resistor and capacitances of the capacitor,
wherein a resistance of the resistor and/or a capacitance of the capacitor is variable,
wherein the first terminal of the resistor, the first terminal of the capacitor, and the first input of the amplifier are coupled together at a common node,
wherein the second input of the amplifier is coupleable to a reference voltage,
wherein the output of the amplifier is coupled to the second terminal of the resistor and to the second terminal of the capacitor,
wherein the first terminal of the resistor, the first terminal of the capacitor, and the first input of the amplifier are coupleable to a reference current source at the common node, and
wherein the time constant calibration circuit is operable to perform a time constant calibration process comprising one or more calibration cycles in which:
the first switch and the second switch selectively route a reference current provided by the reference current source using the digital logic:
through the resistor in a first phase of the, or each, calibration cycle; and
through the capacitor in a second phase of the, or each, calibration cycle, and
the resistance of the resistor and/or the capacitance of the capacitor is adjusted, using the digital logic, between each calibration cycle iteratively to determine an adjusted resistance of the resistor and/or an adjusted capacitance of the capacitor for producing said time constant.

2. The time constant calibration circuit of claim 1, wherein the common node is a virtual ground node.

3. The time constant calibration circuit of claim 1, comprising a comparator having a first input selectively coupleable to the second terminal of the resistor and/or the second terminal of the capacitor.

4. The time constant calibration circuit of claim 3, comprising the digital logic operable to adjust the resistance of the resistor and/or the capacitance of the capacitor between each calibration cycle based on a signal received from an output of the comparator.

5. The time constant calibration circuit of claim 3, further comprising a comparator switch coupled between the output of the comparator and a second input of the comparator, wherein:
in the first phase the calibration circuit is operable to close the comparator switch to configure the comparator in a voltage follower mode in which a voltage at the first input of the comparator is copied to the second input of the comparator, and
in the second phase the calibration circuit is operable to open the comparator switch.

6. The time constant calibration circuit of claim 5 comprising a storage capacitor coupled to the second input of the comparator for storing said voltage copied to the second input of the comparator in said first phase.

7. The time constant calibration circuit of claim 1, comprising the digital logic operable to open/close the first and second switches to configure the time constant calibration circuit for the first phase and the second phase.

8. The time constant calibration circuit of claim 1, operable to output a control signal corresponding to a resistance value and/or a capacitance value determined by the time constant calibration circuit during said time constant calibration process.

9. A continuous-time sigma-delta analog-to-digital converter comprising:
a time constant calibration circuit comprising:
a resistor having a first terminal and a second terminal;
a capacitor having a first terminal and a second terminal;

an amplifier having a first input, a second input, and an output;
a plurality of switches including a first switch and a second switch; and
digital logic configured to control the plurality of switches and adjust resistances of the resistor and capacitances of the capacitor,
wherein a resistance of the resistor and/or a capacitance of the capacitor is variable,
wherein the first terminal of the resistor, the first terminal of the capacitor and the first input of the amplifier are coupled together at a common node,
wherein the second input of the amplifier is coupleable to a reference voltage,
wherein the output of the amplifier is coupled to the second terminal of the resistor and to the second terminal of the capacitor,
wherein the first terminal of the resistor, the first terminal of the capacitor and the first input of the amplifier are coupleable to a reference current source at the common node, and
wherein the time constant calibration circuit is operable to perform a time constant calibration process comprising one or more calibration cycles in which:
the first switch and the second switch selectively route a reference current provided by the reference current source using the digital logic:
through the resistor in a first phase of the, or each, calibration cycle; and
through the capacitor in a second phase of the, or each, calibration cycle, and
the resistance of the resistor and/or the capacitance of the capacitor is adjusted between each calibration cycle iteratively to determine an adjusted resistance of the resistor and/or an adjusted capacitance of the capacitor for producing said time constant.

10. The continuous-time sigma-delta analog-to-digital converter of claim 9, further comprising an analog filter having one or more analog integrators, wherein the time constant calibration circuit is operable to output a control signal corresponding to a resistance value and/or a capacitance value determined during said time constant calibration process to the one or more analog integrators.

11. A time constant calibration method comprising:
providing a calibration circuit comprising:
a resistor having a first terminal and a second terminal;
a capacitor having a first terminal and a second terminal;
an amplifier having a first input, a second input, and an output;
a plurality of switches including a first switch and a second switch; and
digital logic configured to control the plurality of switches and adjust resistances of the resistor and capacitances of the capacitor,
wherein a resistance of the resistor and/or a capacitance of the capacitor is variable,
wherein the first terminal of the resistor, the first terminal of the capacitor and the first input of the amplifier are coupled together at a common node,
wherein the second input of the amplifier is coupled to a reference voltage,
wherein the output of the amplifier is coupled to the second terminal of the resistor and to the second terminal of the capacitor,
wherein the first terminal of the resistor, the first terminal of the capacitor and the first input of the amplifier are coupled to a reference current source at the common node; and
performing a time constant calibration process comprising one or more calibration cycles in which:
the first switch and the second switch selectively route a reference current provided by the reference current source using the digital logic:
through the resistor in a first phase of the, or each, calibration cycle; and
through the capacitor in a second phase of the, or each, calibration cycle, and
the resistance of the resistor and/or the capacitance of the capacitor is adjusted, using the digital logic, between each calibration cycle iteratively to determine an adjusted resistance of the resistor and/or an adjusted capacitance of the capacitor for producing said time constant.

12. The time constant calibration method of claim 11, wherein the common node is a virtual ground node.

13. The time constant calibration method of claim 11, wherein the time constant calibration circuit comprises a comparator having a first input selectively coupleable to the second terminal of the resistor and/or the second terminal of the capacitor, the method further comprising adjusting the resistance of the resistor and/or the capacitance of the capacitor between each calibration cycle based on a signal received from an output of the comparator.

14. The time constant calibration method of claim 13, further comprising operating the comparator in a voltage follower mode in which a voltage at the first input of the comparator is copied to a second input of the comparator for storage of the voltage copied to the second input of the comparator.

* * * * *